(12) United States Patent
Degani et al.

(10) Patent No.: US 6,396,711 B1
(45) Date of Patent: May 28, 2002

(54) INTERCONNECTING MICROMECHANICAL DEVICES

(75) Inventors: Yinon Degani, Highland Park; Thomas Dixon Dudderar, Chatham; King Lien Tai, Berkeley Heights, all of NJ (US)

(73) Assignees: Agere Systems Guardian Corp., Orlando, FL (US); Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/588,336

(22) Filed: Jun. 6, 2000

(51) Int. Cl.[7] .................................................. H05K 7/02
(52) U.S. Cl. ....................... 361/760; 361/761; 361/785; 361/791; 439/61
(58) Field of Search ................................ 361/737, 790, 361/760, 761, 735, 785, 684, 791; 439/61

(56) References Cited

U.S. PATENT DOCUMENTS 4,472,765 A * 9/1984 Hughes ...................... 361/413
5,926,378 A * 7/1999 DeWitt et al. ............... 361/788
6,169,325 B1 * 1/2001 Azuma et al. ............... 257/685
6,202,110 B1 * 3/2001 Coteus et al. ................ 710/102

* cited by examiner

Primary Examiner—Jeffrey Gaffin
Assistant Examiner—Thanh Yen Tran
(74) Attorney, Agent, or Firm—Peter V. D. Wilde; Thomas, Kayden, Horstemeyer & Risley LLP

(57) ABSTRACT

The specification describes interconnection strategies for micro-electronic machined mechanical systems (MEMS). Typical MEMS device array comprise a large number of individual mechanical devices each electrically driven by multi-chip modules (MCMs). High density interconnection is achieved by mounting the MCMs mounted on both sides of a system interconnection substrate. Overall interconnection length is reduced by locating the MCMs in a common circuit driving a given mechanical element on opposite sides of the system interconnection substrate and interconnecting them using vias through the substrate. Rapid replacement/repair is facilitated by mounted all active elements in sockets using contact pin arrays for electrical connections. In service reliability is obtained by providing spare sockets for redundant MCMs.

12 Claims, 3 Drawing Sheets

INTERCONNECTING MICROMECHANICAL DEVICES

FIELD OF THE INVENTION

This invention relates to interconnection technology and more specifically to interconnecting micro-electronic machined mechanical systems (MEMS).

BACKGROUND OF THE INVENTION

New photonic devices are in development that use micromechanical elements. In principal, micromechanical elements can be built on a variety of platforms. However, the substrate of choice is typically a semiconductor wafer, e.g. silicon. Highly and often elegantly engineered silicon processing can be used to make new device structures that combine the mechanical and optical properties of silicon. An advanced technology, silicon optical bench technology, has been developed to implement this approach. Typically the micromechanical devices or subassemblies are formed in large integrated arrays, referred to here as MEMS, to perform a common function in a parallel mode. The substrate for the arrays is usually a silicon wafer or a large silicon chip. In most instances the MEMS device arrays comprise photonic devices, and are accessed with optical I/O signals.

Among the most promising of the photonic MEMS devices are optical cross connect devices. These may be used in optical networking for routing optical signals from one array of optical channels to another. Optical cross connects are typically made in the form of compact arrays of micromechanical mirrors. An input array, usually a linear array, of optical waveguides are arranged to address the mirror array, which steers optical beams from the input array to a corresponding output array of optical waveguides. The input and output optical channels may be optical waveguides in an optical integrated circuit, or may be arrays of optical fibers.

These optical cross connect devices can switch one of a large number of optical inputs between a selected one of a large number of optical outputs. For example, a 10 fiber input array used with a 10 fiber output array has the capacity to make 100 individual connections. Each channel typically has tens or, in future systems, hundreds of channels wavelength division multiplexed (WDM) together. The information handling capacity of such a switch is extremely large.

State of the art optical networking systems require large compact arrays of micromechanical mirrors. The micromechanical mirrors are electrically operated using control electrodes, and mirror tilt is controlled by electrostatic fields selectively applied to the control electrodes.

In a standard optical networking system, for n input fibers an $n^2$ mirror array is used. Each input fiber accesses an associated row of, for example, ten mirrors and each of the ten mirrors addresses one of ten output fibers. In a typical operating cross connect, for example, the first three mirrors are not activated, i.e. do not intersect the beam path, and the fourth is electrically tilted to intersect the beam path and steer the beam to its associated fiber. In this way the first fiber can address a selected one of ten mirrors and thus a selected one of ten fibers. This $n^2$ mirror array requires two tilt positions, on and off. An alternative mirror arrangement uses 2n mirrors for the same 10×10 switch. It operates by steering the optical beam to one of ten positions, and has two way tilt capability.

For illustration of the interconnection problem, the $n^2$ embodiment will be analyzed.

A 32 channel WDM system requires a 32×32 mirror array. With four independent electrical address means per mirror the total number of interconnections is 4096. Moreover, each mirror in the array has an associated IC driver, which may include an amplifier and digital-to analog- converter (DAC). The amplifiers and DACS may each comprise several or many, e.g. six, IC chips. Using conventional circuit board assembly this level of interconnection requires many large printed circuit boards.

SUMMARY OF THE INVENTION

We have developed an interconnection system for MEMS device arrays that integrates, on a common system interconnection substrate, the MEM device array with the IC control circuits required to drive the MEM device array. Taking as an example, a MEMS optical switching assembly for a 32 channel WDM switch, and two multiple-chip IC modules per channel, the interconnection system of the invention integrates a 1024 mirror array with 64 modular IC drivers for the mirror array. The IC modules are multichip modules (MCMs) and are socket mounted on the common interconnection substrate using both sides of the substrate. This allows pairs of MCMs serving a given WDM channel to be located in close proximity above and below the common interconnection substrate. A redundant interconnection strategy provides uninterrupted operation and the socket mounting strategy allows rapid replacement of defective parts. A contact pin array may be used for interconnecting the MEM device assembly and the MCMs in the sockets. The use of a contact pin array allows the MEMS devices and the MCMs to be easily demountable for replacement or repair.

DETAILED DESCRIPTION

Figure 1:
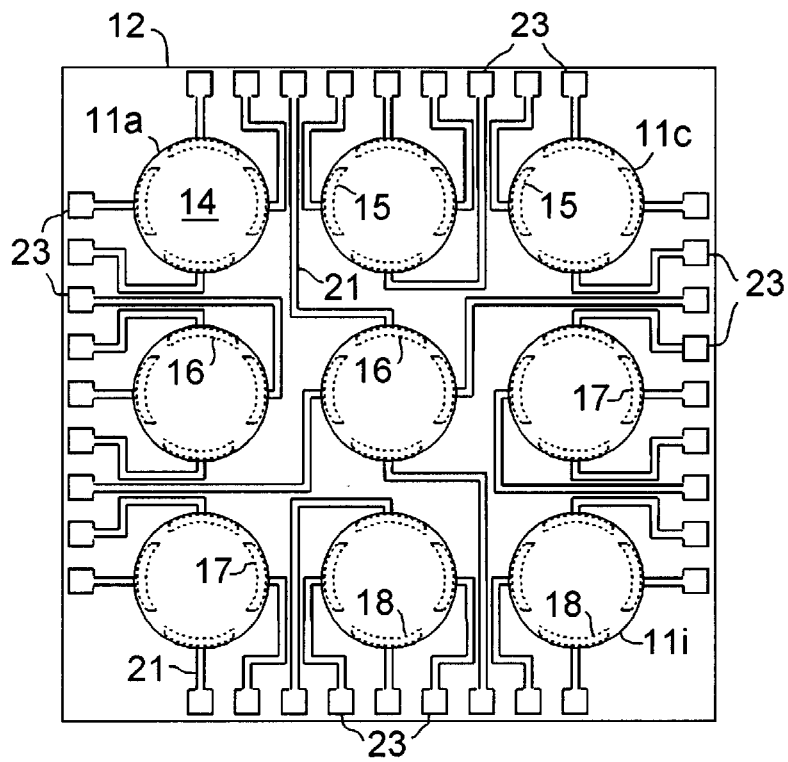
FIG. 1 is a schematic view of a MEMS device array, in this embodiment a mirror with four way tilt for an optical cross connect, that is presented by way of example of devices that may be interconnected using the invention.

Referring to FIG. 1, a 3×3 micromechanical mirror array is shown by way of example of a MEMS device array that is advantageously interconnected according to the invention. The 3×3 array of micromechanical devices comprises nine micromechanical mirrors, shown as 11a–11i, mounted on silicon substrate 12. The individual mirror devices in the array comprise mirror surface 14, with four way tilt capability, and drive electrodes 15–18, shown in phantom. Control of the tilt is effected electrostatically by application of voltages selectively to electrodes 15–18. This normally requires that each of the four electrodes be independently addressable. Runners 21 interconnect the four electrodes for each device 11a–11i to bond pads 23. An array of n devices, requires 4n independent electrical interconnections. In principle, fewer electrical connections can be used but the preferred choice is that shown. This interconnection requires a total of 36 individual runners and bond pads for the 3×3 array.

In an optical cross connect, the mirrors in the array communicate with optical beams in optical waveguides. The waveguides are not part of the invention and for simplicity in presenting the invention are not shown. The size, 3×3, of the array is chosen here for convenience in illustrating the complexity of the electrical interconnections required for large micromechanical device arrays. Device arrays in current development may have dozens or even hundreds of micromechanical mirrors on a single silicon platform. As the number of micromechanical devices is multiplied, the interconnection problem becomes formidable.

The micromechanical mirror device is given by way of example only of a wide variety of electrically driven micromechanical elements that may be fabricated in large arrays on a common substrate. It is presented for illustration of the problems associated with interconnecting large micromechanical device arrays.

Figure 2:
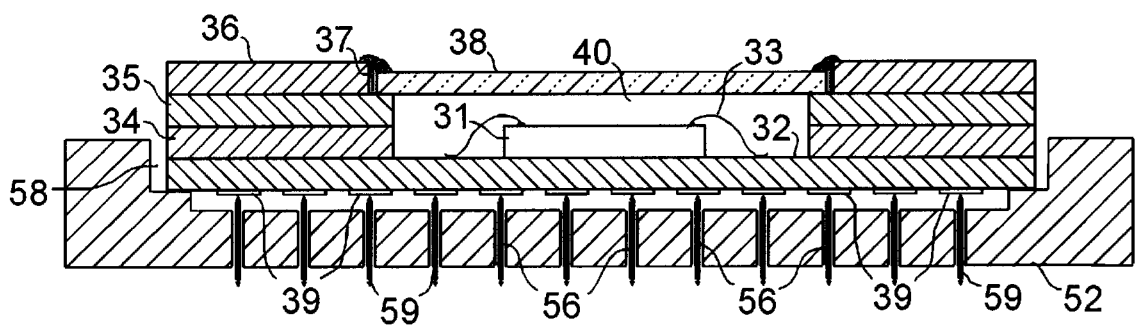
FIG. 2 is a schematic representation showing a typical MEMS assembly and its associated socket.

Due to the obvious fragility of MEMS devices, they should be well protected from hostile ambients. For normal service environments they should be entirely enclosed and preferably hermetically sealed, while still allowing optical access. Due to the mechanical nature of MEMS devices, the package should provide mechanical integrity and dimensional stability. An MEMS module of the type suitable for interconnection using the interconnection system of the invention is shown in FIG. 2. The MEMS module is shown mounted in a contact pin array socket to facilitate rapid removal and replacement.

In FIG. 2, a silicon substrate 32 is shown with MEMS device 31 mounted on the silicon substrate. Elements with reference numbers in the thirties denote parts of the MEMS module. The socket elements are designated with numbers in the fifties.

The silicon substrate 32 may be single crystal, polycrystal (polysilicon) or amorphous silicon. The MEMS device may be die bonded to substrate 32 and interconnected using wire bonds 33. The wire bonds interconnect bond pads (23 in FIG. 1) to substrate pads (not shown). It will be understood by those skilled in the art that any of a variety of mounting schemes may be used, with the main objective being matching the coefficient of thermal expansion, $t_c$, of the MEMS device to the substrate on which it rests. The electrical interconnection between MEMS device 31 and the substrate 32 can take many forms. With a silicon substrate, it is convenient to use standard IC interconnect technology. Typically this will comprise a grown or deposited oxide, and aluminum metallization interconnect patterns photolithographically formed on the oxide. According to one embodiment of the invention, a silicon chamber is provided to enclose the MEMS device. In the arrangement shown in FIG. 2, the sidewalls of the chamber are constructed with silicon wafers 34, 35 and 36. The individual wafers are prepared with large openings to accommodate the MEMS device as shown. The openings may be formed using deep etching techniques, such as RIE, or may be laser drilled, or produced by other suitable methods. After forming the openings, the wafers may be affixed together using standard wafer bonding methods. For example, the surfaces of the wafers may be oxidized to form a very thin oxide, e.g. 0.1–5 microns, and the wafers bonded together using thermocompression bonding. It is preferred that no "foreign" material (other than, in the prior example, a very thin $SiO_2$ layer) be used in constructing the sidewalls and bottom of the silicon chamber. This preserves the material homogeneity and the attendant uniform thermomechanical properties for the whole assembly.

The top of the chamber 40 is capped with a transparent windowpane 38. The windowpane may be fused quartz of other suitable material transparent to the wavelength used for the optical beams being deflected in the MEMS device. Typically this wavelength is 1.3 or 1.55 nm. In FIG. 2 the sidewall 37 of the opening in the top silicon wafer 36 is indented from the chamber 40 to provide a ledge for windowpane 38. It is preferred that the opening in wafer 36 be larger than the width of the window. This allows the window pane, which comprises the only material forming the chamber which is not precisely thermomechanically matched, to "float". Thus differential thermal expansion between the chamber walls and the windowpane is accommodated by the space between the chamber wall at the windowpane seat, and the windowpane itself. The windowpane can be sealed to the chamber using a resilient filler/adhesive, which can be selected from, e.g., a variety of silicone materials.

In FIG. 2, three silicon wafers are used in forming the sidewalls of the sealed chamber 40. The number of wafers needed will depend on the thickness of the wafers, the height of the MEMS device, and the standoff desired between the top of the MEMS device and the windowpane 38. If the substrate for the MEMS device is thinned by conventional thinning techniques, then a single standard 20–30 mil thick wafer may be sufficient for constructing the chamber sidewall.

The use of silicon wafers for forming the chamber sidewall is but one example of several options that will occur to those skilled in the art. Alternatively, a collar of silicon may be attached to the silicon substrate 32. The collar may also be machined to provide a ledge for the windowpane. The windowpane may also rest on top of the collar, or the top wafer 36 in FIG. 2, i.e. without a seat, to provide a similar result.

It should be evident to those skilled in the art that the size of the various elements in these figures are for convenience in illustrating the principles of the invention and are not necessarily to scale. The 3×3 array shown is for convenience in exposition. A more typical array, as suggested above, is 32×32 micromechanical devices on a 3.2 cm substrate, which allows an approximate single device size of 1 mm$^{2}$. Also, the array configuration, with x- and y-rows, is by way of example only. Other arrangements, e.g. with alternate rows offset and rows interleaved, may also be used.

Referring again to FIG. 2, substrate 32 is provided with an array of contact pads 39 arranged for plug-in connection to socket 52 as shown in FIG. 2. Contact pads 39 interconnect with the MEMS device within the chamber. This interconnection may be made by any suitable arrangement, such as vias extending through the bottom of the chamber assembly. The material of the socket may be ceramic, plastic, or epoxy. The socket 52 is provided with a plurality of spring loaded contact pins 56 which bear against contact pads 39 but are not attached thereto. This allows the MEMS device to be removed easily for replacement or repair. It also allows the electrical connections to mechanically float, thus preventing differential thermal expansion, or other mechanical stress, on socket 52, or on the next interconnect level, from being translated to the MEMS device. A space 58 is provided around the MEMS device when mounted in the socket for easy access and also to allow the MEMS device to float on the base of socket 52, thereby eliminating strains in the socket from imposing stresses on the MEMS device. The space is large enough to accommodate strain relief but small enough to prevent movement of any of the contact pads 39 away its associated contact pin 56. The bottom of the contact pins 59 is electrically connected to the system board to be described below. The system board may be an epoxy printed wiring board (PWB) or other suitable interconnect substrate. It will be noted that the MEMS device is mounted in a dual socket, i.e. socket 52, into which the MEMS device itself is inserted, and the socket 52 in turn is mounted on the system interconnection substrate using a contact pin array mounting arrangement. Either the MEMs device or the socket can easily be demounted, but the socket will usually be fixed to the system interconnection substrate.

In a typical state of the art MEMS optical switching system, the overall system may include more than one MEMS device. It will also include many integrated circuits for several functions, e. g. drive circuits for the MEMS, amplifiers, digital-to-analog converters (DACS), etc. These multiple elements are electrically connected in a large, complex, interconnection system. Failure of any module in the system is advantageously met with rapid repair facility. According to a main feature of the invention, each of the active elements in the system is interconnected in such a way as to facilitate rapid removal for replacement or repair. Thus in the MEMS assembly shown, the MEMS device is demountable. The IC drive circuits are also demountable.

Figure 3:
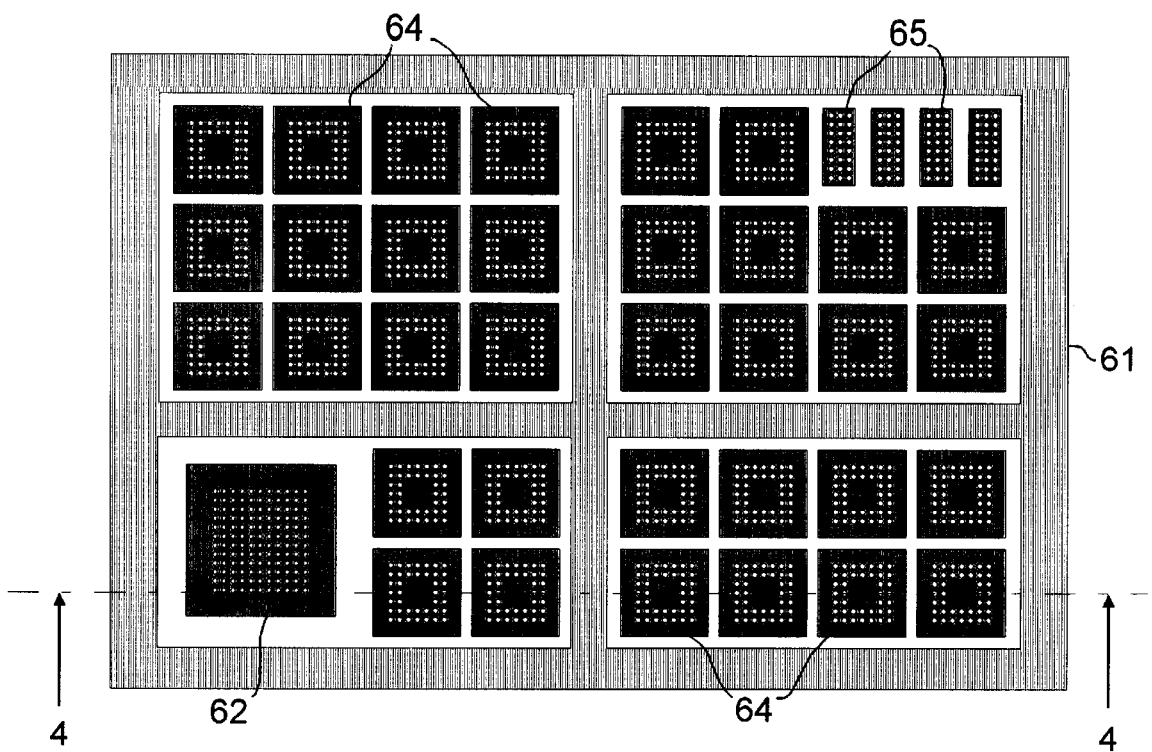
FIG. 3 is a plan view of the system interconnection substrate of the invention.

A system interconnection substrate with means for mounting, in a demountable fashion, all of the active components of the system on a single substrate is shown in plan view in FIG. 3. The system interconnection substrate, 61, is provided with socket 62 for the MEMS device, and sockets 64 for the IC driver modules. Sockets 65, for interface control chips, may also be provided.

Figure 4:
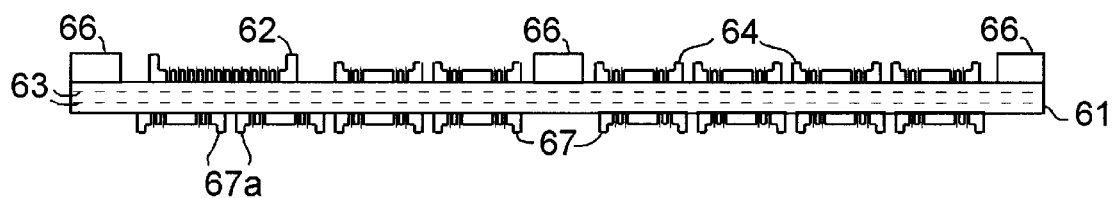
FIG. 4 is a section view through 4—4 of FIG. 3.

A section view, along section line 4—4 of FIG. 3 is shown in FIG. 4. The system interconnection substrate is shown with a rigid frame 66 to provide structural support. Sockets 67 are provided on the bottom side of the system interconnection substrate to accommodate additional IC driver modules. To accommodate the large number of printed circuit interconnections required, the system interconnection substrate may be a multilevel board. Dashed lines 63 in FIG. 4 illustrate this option. The multilevel board may be ceramic or epoxy or other suitable construction.

Figure 5:
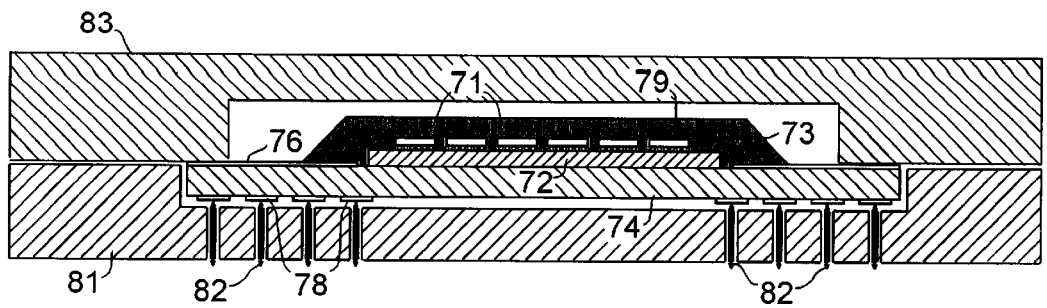
FIG. 5 is a schematic representation of an MCM suitable for insertion into a socket of the system interconnection substrate of FIGS. 3 and 4.

A typical IC driver module according to the invention is shown in FIG. 5. This module is representative of an amplifier for one of the 32 micromechanical mirrors in the system. The module comprises IC chips 71, flip-chip bonded by solder bumps to substrate 72. The substrate may ceramic or epoxy or other suitable material, but is preferably silicon. Wire bonds 73 interconnect IC chips 71 and substrate 72. Substrate 72 is supported on a printed wiring board (PWB) 74. Substrate 72 has an interconnection pattern 76 that is interconnected with contact pad array 78 through vias (not shown) in the PWB 74. A plastic overmolding 79 may be provided for protection of the IC chips. The IC chips 71, substrate 72, and the interconnections, will be recognized as a multi-chip module (MCM). Many forms of MCMs are known in the art of which the version shown is but one example. The overall MCM package resembles a land grid array MCM, with land pads 78 positioned for engagement with a contact pin array in the manner described in connection with FIG. 2. In other alternative arrangements the IC chips 71 may be wire bonded to substrate 72, or the substrate 72 may be eliminated and the IC chips flip-chip bonded or wire bonded directly to substrate 76. In many cases the substrate 72 will be found useful for discrete circuit elements.

FIG. 5 shows the MCM inserted into socket 81. The socket corresponds to one of the sockets 64 in FIG. 4. The socket has a contact pin array 82 of the kind described in connection with FIG. 2. For additional protection of the IC devices, a cover 83 may be provided.

Figure 6:
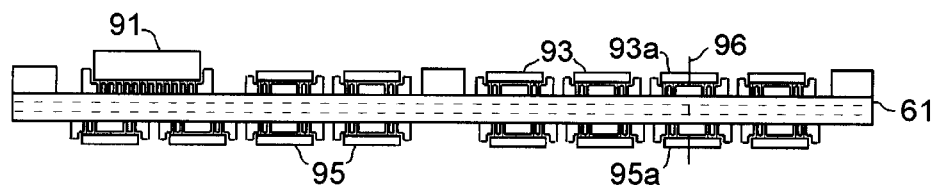
FIG. 6 is a view similar to that of FIG. 4 showing MCMs installed on the system interconnection substrate.

The system interconnection substrate 61 of FIG. 4 is shown in FIG. 6 populated with IC driver MCMs and MEMS module 91. The MCMs on the top surface of substrate are designated 93 and the MCMs on the bottom surface of the substrate are designated 95.

Figure 7:
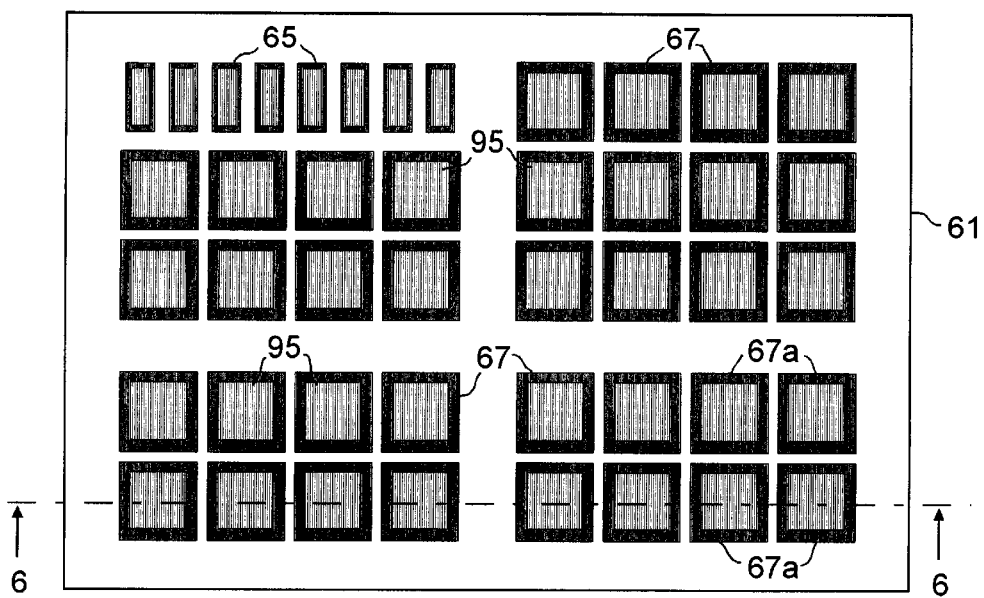
FIG. 7 is a plan view similar to that of FIG. 3, showing the bottom side of the system interconnection substrate with MCMs installed.

A plan view of the bottom surface of the system interconnection substrate 61 is shown in FIG. 7. The edges of the sockets are visible at 67, with MCMs 95 inserted therein. FIG. 6 is a view along 6—6 of FIG. 7. In a typical assembly, means (not shown) are provided for holding modules 91 in place. The means may be spring clips for each module, or may comprise a hold down frame over the whole substrate.

In a preferred embodiment of the invention, the MCMs on the top and bottom surfaces, respectively, are essentially the same, i.e. the MCMs 93 are the same, and may provide one circuit function, and the MCMs 95 are the same, and may provide a different circuit function. In the example described in detail here, MCMs 93 are amplifier MCMs and MCMs 95 are digital-to-analog converters. The reverse arrangement is considered equivalent. Digital-to-analog converters are used in a mirror array where each mirror is to provide several tilt positions. Other mirror arrays may only require two tilt positions. Thus other MCMs with other circuit functions may be required. However, a feature of the invention is to locate the MCMs that operate a given mechanical device (here a mirror) at the same top/bottom position on the system interconnection substrate. For example, in FIG. 6, MCM 93a is an amplifier module operating in a drive circuit for a given mirror, and MCM 95a is a digital-to-analog converter in the same drive circuit. They are aligned as shown approximately centered with axis 96 that extends through and normal to the system interconnection substrate. In this manner, the electrical path interconnecting the MCMs for a given electrical circuit is minimized. This feature is important in reducing the total interconnection length in the system and helps make possible the integration of the entire system on the same substrate.

For a complex system of the kind described here, system reliability is an important issue. System reliability is treated here in three contexts. The first is manufacturing reliability, where the ability of the system design to be manufactured with high yield is important. The second is design reliability where the system design allows scaling and other modifications for different system needs. The third is service reliability which means the ability of the system to avoid service interruptions due to circuit or mechanical failure in the service environment. All three are provided by the interconnection arrangement of the invention.

High system manufacturing yield results from having all components in the system socket mounted. Any component that fails insertion in the system assembly phase of manufacture is easily demounted and replaced. In a corresponding system assembly where components are soldered or otherwise permanently attached, failure of a component during assembly often requires inefficient and costly reworking.

A high level of system design reliability is provided by the arrangement described wherein the size of the system, i.e. the number of mechanical devices, can be changed by merely adding or subtracting sockets. This allows a modular design strategy, where the same basic substrate design may be used in modules of 8 drive circuits for systems of 8, 16, 24 or 32 mechanical elements with very simple circuit modification. It may prove cost effective to use a single board with, e.g. drive circuits for 32 mechanical devices, as a universal interconnection block for 24 or 32 mechanical elements.

The third reliability category, in-service reliability, is of particular consequence in the context of the invention. The optical switching cross connect described here will function in a communication system carrying a huge amount of traffic. A single 32 channel WDM switch may carry 80 multiplexed high speed signals, and serve hundreds of customers. It would be desirable to design such a switch with total in-service reliability, i.e. essentially no chance of service interruption. According to a feature of the invention, the system is provided with not only rapid removal and replacement capability due to the socket interconnections for all active device elements, but also is provided with a redundant feature for uninterrupted operation. The system interconnection substrate of FIGS. 3, 4, 6, and 7 is designed for a MEMs with 32 mechanical (here mirror) elements. The drive circuit requirement for each of the mechanical elements in this embodiment is one MCM for the amplifier, and one MCM for the digital-to-analog converter. The 32 amplifier MCMs and the 32 digital-to-analog converter MCMs require interconnection of 64 MCMs for the system. In the embodiment shown, 32 amplifier MCM sockets are provided on the top side of substrate 61, and 32 digital-to-analog converter MCM sockets are provided on the bottom side. There are spare sockets on both sides to accommodate spare MCMs. FIG. 3 shows 34 MCM sockets on the top side of substrate 61, allowing two spare amplifier MCMs. FIG. 7 shows 36 MCM sockets on the bottom side of the substrate, which, as shown, allows for 4 spare digital-to-analog converter MCMs. Alternatively, sockets 67a in FIGS. 4 and 7 may be used for a spare MEMs device, in which case spare MCM sites can be added in place of sites 65 (FIG. 7). In other embodiments of the invention the MEMs device or devices may be mounted on a separate substrate. A number of other variations on the arrangements shown and described here will occur to those skilled in the art. The basic feature of this aspect of the invention is a system for n mechanical elements with (n+x) sockets, and (n+x) MCMs, where x is one or greater. In the embodiment described above, where the drive circuit for each mechanical element requires a first kind of MCM module providing one circuit function, designated $MOD_A$, and a second kind of MCM module, designated $MOD_B$ providing another circuit function, and a double sided system interconnection substrate is used with a plurality of $MOD_A$s on one side of the system interconnection substrate and a plurality of $MOD_B$s on the other side of the system interconnection substrate, the generalized prescription becomes:

a system interconnection substrate for n circuits driving n mechanical devices comprising (n+x) $MOD_a$s on one side of the substrate and (n+x') $MOD_B$s on the other side of the substrate, where x and x' are one or greater and may be the same or different. It may further be characterized, according to a feature described earlier, as having a $MOD_A$ and a $MOD_B$ for each of n circuits approximately centered on an axis extending through and normal to the system interconnection substrate.

When used herein, the term essentially identical circuit function, or close variants thereof, is intended to convey the fact that each of the MCM modules located on the top side of the system interconnection substrate performs essentially the same circuit function, and each of the MCMs on the bottom of the system interconnection substrate performs essentially the same function, with the proviso that the function performed by MCMs on the top side of the system interconnection substrate is not the same as the function performed by the MCMs on the bottom side of the system interconnection substrate. Broadly speaking, each pair of $MOD_A$s and $MOD_B$s in a common electrical drive circuit are electrically connected in series, and the pairs of $MOD_A$s and $MOD_B$s serving the n array of mechanical devices are electrically connected in parallel.

The term silicon when used herein to describe the material of an element of the interconnection system of the invention is intended to include single crystal silicon, polycrystal silicon (polysilicon) or amorphous silicon.

Various additional modifications of this invention will occur to those skilled in the art. All deviations from the specific teachings of this specification that basically rely on the principles and their equivalents through which the art has been advanced are properly considered within the scope of the invention as described and claimed.

We claim:
1. An interconnection system for interconnecting:
   a. a micro-electronic machined mechanical (MEMS) assembly, the MEMS assembly comprising a silicon substrate with a top surface and a bottom surface, and a MEMS device mounted on the top surface, with
   b. a first plurality of multi-chip modules (MCMs), and
   c. a second plurality of multi-chip modules (MCMs), the MCMs in the first plurality of multi-chip modules and the MCMs in the second plurality of multi-chip modules each comprising a planar MCM substrate with at least one IC chip mounted on the planar MCM substrate, the interconnection system comprising:
   i. a double sided system interconnection substrate, the system interconnection substrate having a top side and a bottom side,
   ii. a first plurality of sockets mounted on the top side of the system interconnection substrate,
   iii. a second plurality of sockets mounted on the bottom side of the system interconnection substrate,
   iv. at least one MEMs assembly inserted in a socket on the system interconnection substrate,
   v. the first plurality of MCMs inserted directly in the first plurality of sockets on the top side of the system interconnection substrate with the MCM substrates parallel to the system interconnection substrate,
   vi. the second plurality of MCMs inserted directly in the second plurality of sockets on the bottom side of the system interconnection substrate with the MCM substrates parallel to the system interconnection substrate, and
   vii. means including vias through the system interconnection substrate for electrically connecting the first plurality of sockets and the second plurality of sockets through the system interconnection substrate.

2. The system of claim 1 wherein pairs of MCMs are formed by one of the first plurality of MCMs and one of the second plurality of MCMs and the pairs are approximately centered on an axis extending through and normal to the system interconnection substrate.

3. The system of claim 2 wherein the first plurality of MCMs each comprises an amplifier circuit, and the second plurality of MCMs each comprises a digital-to-analog converter circuit.

4. The system of claim 2 wherein the pairs of MCMs comprise a common circuit.

5. An interconnection system for interconnecting:
   a. a micro-electronic machined mechanical (MEMS) assembly, and
   b. a first plurality of multi-chip modules (MCMs), each of the MCMs comprising an MCM substrate having a top side and a bottom side with at least two IC chips on the top side and a plurality of MCM electrical contact pads on the bottom side, and
   c. a second plurality of multi-chip modules (MCMs), each of the MCMs comprising an MCM substrate having a top side and a bottom side with at least two IC chips on the top side and a plurality of MCM electrical contact pads on the bottom side, the interconnection system comprising:
   i. a double sided system interconnection substrate, the system interconnection substrate having a top side and a bottom side,
   ii. a first plurality of sockets mounted on the top side of the system interconnection substrate,
   iii. a second plurality of sockets mounted on the bottom side of the system interconnection substrate,
   wherein the first plurality of sockets and the second plurality of sockets each comprise a socket substrate, and a socket contact pin array extending through the socket substrate,
   iv. the first plurality of MCMs inserted directly in the first plurality of sockets on the top side of the system interconnection substrate with the MCM substrate parallel to the system interconnection substrate and with the MCM electrical contact pads contacting a socket contact pin array,
   v. the second plurality of MCMs inserted directly in the second plurality of sockets on the bottom side of the system interconnection substrate with the MCM substrate parallel to the system interconnection substrate and with the MCM electrical contact pads contacting a socket contact pin array, and
   vi. means including vias through the system interconnection substrate for electrically connecting the first plurality of sockets and the second plurality of sockets through the system interconnection substrate.

6. The system of claim 5 further including at least one MEMs assembly inserted in a socket on the system interconnection substrate and wherein the MEMs assembly comprises a silicon substrate with a top surface and a bottom surface, a MEMS device mounted on the top surface, and a plurality of MEMs electrical contact pads on the bottom surface, with the contract pin array in the socket substrate contacting the MEMs contact pad array.

7. The system of claim 6 wherein all of the first plurality of MCMs perform an essentially identical circuit function, and all of the second plurality of MCMs perform an essentially identical circuit function.

8. The system of claim 7 wherein the circuit function performed by the first plurality of MCMs is different from the circuit function performed by the second plurality of MCMs.

9. The system of claim 8 wherein pairs of MCMs are formed by one of the first plurality of MCMs and one of the second plurality of MCMs and each pair is located on a common axis extending through and normal to the system interconnection substrate and is electrically connected together.

10. The system of claim 9 wherein the MEMs assembly comprises n mechanical elements and the first and second plurality of MCMs each comprises (n+x) MCMs where x is one or greater.

11. The system of claim 10 wherein the MEMs device has n mechanical elements and the first plurality of MCMs comprises a plurality of (n+x) of a first kind of MCM designated $MOD_A$ providing one circuit function, and the second plurality of MCMs comprises a plurality of (n+x) of a second kind of MCM designated $MOD_B$ providing a second circuit function, where x and x' are greater than 1.

12. The system of claim 6 wherein at least one of the sockets is mounted on the system interconnection substrate using contact pins.

* * * * *